United States Patent [19]
Katoh et al.

[11] Patent Number: 5,130,743
[45] Date of Patent: Jul. 14, 1992

[54] IMAGE FORMING APPARATUS HAVING MEANS FOR INDICATING TIMING OF HEAT-FIXING FILTER

[75] Inventors: Tokunori Katoh, Ichinomiya; Hiroshi Morisaki, Aichi, both of Japan

[73] Assignee: Brother Kogyo Kabushiki Kaisha, Nagoya, Japan

[21] Appl. No.: 600,209

[22] Filed: Oct. 19, 1990

[30] Foreign Application Priority Data

Oct. 23, 1989 [JP] Japan .................................. 1-275382
Oct. 24, 1989 [JP] Japan .................................. 1-276373

[51] Int. Cl.$^5$ .............................................. G03B 27/32
[52] U.S. Cl. ........................................ 355/27; 355/30
[58] Field of Search ................. 355/27, 28, 30, 32, 355/206, 215, 282; 219/216; 430/138; 55/162, 271, 213, 273

[56] References Cited

FOREIGN PATENT DOCUMENTS 0132619 7/1985 Japan ...................................... 55/271
2-048013 2/1990 Japan ...................................... 55/271

Primary Examiner—L. T. Hix
Assistant Examiner—Khanh Dang
Attorney, Agent, or Firm—Oliff & Berridge

[57] ABSTRACT

An image forming apparatus, for forming and fixing a visible image on a recording medium including a heat-fixing unit for heat-fixing the visible image on the recording medium, a gas purifying unit for removing foul and harmful components from gas emitted from the recording medium in the image fixing process, a counter for accumulatively counting every image fixing process to produce an accumulative number of recording mediums subjected to the image fixing process, a weighting unit for weighting a count value of the counter in accordance with the type of recording medium to be being subjected to the image fixing process and adding a weighted count value to a just-previously accumulated count value to obtain a present accumulative number, and a control unit for monitoring the present accumulative number of the counter and indicating a time for exchange of the gas purifying unit on the basis of the monitored present accumulative number.

10 Claims, 6 Drawing Sheets

FILTER EXHANGING PROCESS

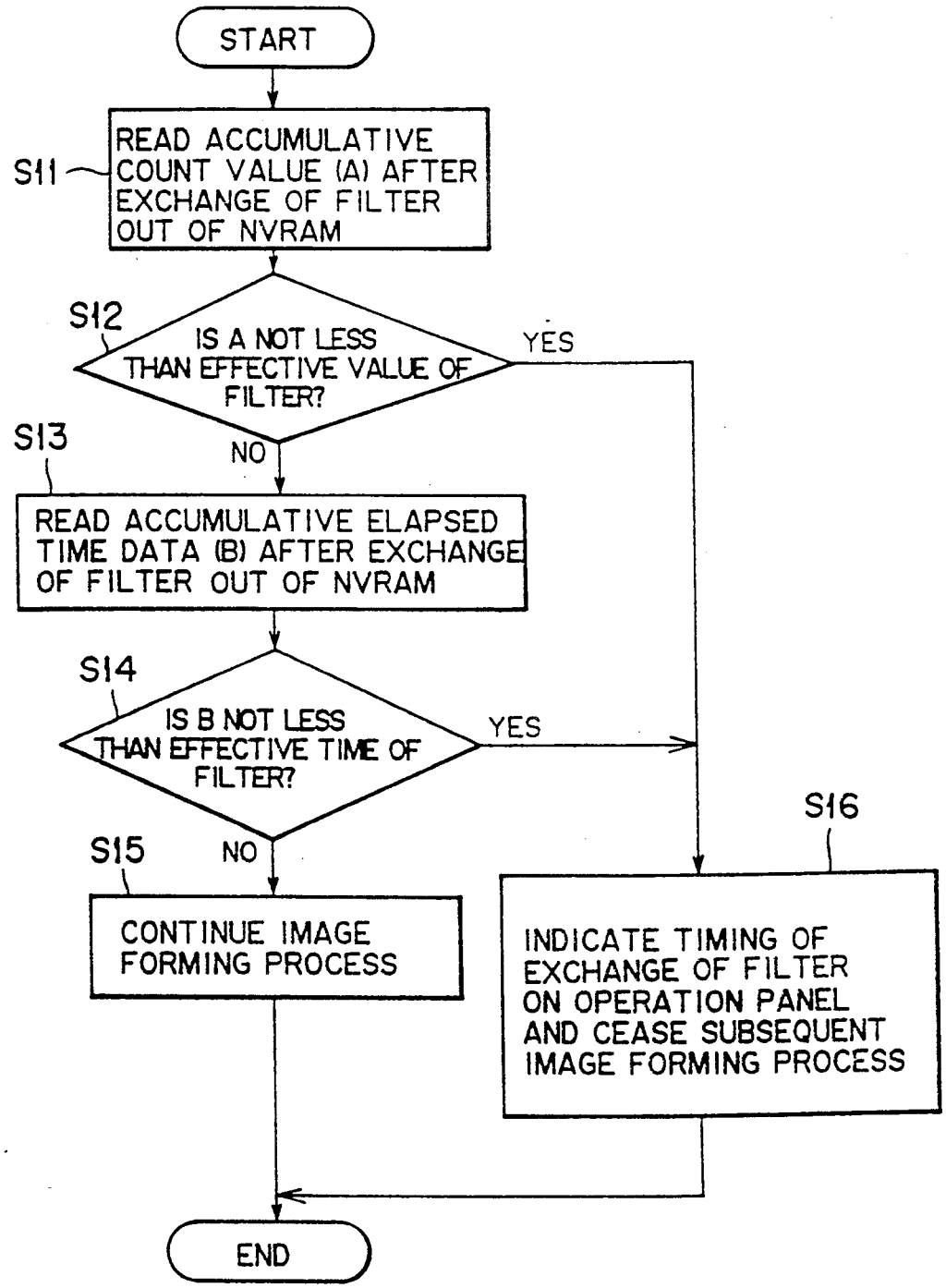

IMAGE FORMING APPARATUS HAVING MEANS FOR INDICATING TIMING OF HEAT-FIXING FILTER

BACKGROUND OF THE INVENTION

This invention relates to an image forming s, and more particularly to an image forming apparatus having a counter for indicating a time for exchange of a filter used in a heat-fixing process.

There has been well known a conventional image forming apparatus such as a copying machine in which a photosensitive and pressure-sensitive recording medium coated with microcapsules encapsulating dye precursor therein is exposed to light to form a latent image thereon, are used. The recording medium is superposed over a developer sheet coated with developer material color-reactable with the dye precursor under pressure to pressure-develop the latent image on the photosensitive and pressure-sensitive recording medium into a visible image on the developer sheet. In this type of image forming apparatus, after the above pressure-developing process, the developer sheet having the visible image thereon is fed to heat-fixing unit comprising a heater where it is a fan, and heated by a heated air or the like to thereby heat-fix the visible image on the developer sheet (that is, perform a heat-fixing process).

In this type of heat-fixing unit, foul and harmful gas is emitted from the developer material coated on a base sheet of the developer sheet due to heat during the heat-fixing process. Thus a user must carry out a copying operation under a harmful condition. Accordingly, it has been required in the art to withdraw the gas including iou and harmful components and protect the user against the foul and harmful components during a series of image forming processes of the apparatus. In order to satisfy this requirement, the heat-fixing unit is equipped with a gas purifying unit having a suction fan for sucking the gas therethrough and a filter for trapping only the foul and harmful components of the gas and discharging only clean air to an outside of the apparatus. The filter is gradually degraded and finally has no capability of trapping the components after a long use thereof. Accordingly, in order to indicate a time for exchanging a used filter for a new one, the apparatus is further provided with a counter (or counting the number of developer sheets which have been subjected to the heat-fixing process (that is, the number of times of the heat-fixing process has been carried out since a filter was exchanged). In this case, when a value counted by the counter reaches a predetermined number, the used filter is exchanged for a new filter.

In the conventional image forming apparatus having the gas purifying unit and the counter, all types of developer sheets are counted equally by the counter irrespective of the kind of the developer sheets that is subjected to a heat-fixing process. For example, when a heat-fixing process is conducted on an OHP developer sheet comprising a base sheet of transparent resin film such as polyethylene film with the developer material coated on the sheet, a larger amount of gas is emitted from the base sheet and the developer material than when a heat-fixing process is used with another type of developer sheet comprising a base sheet of plain paper with developer material coated on the sheet. Accordingly, for use of the OHP developer sheets, the filter is degraded in gas purifying capability before a counted value of the counter reaches the predetermined number, so that foul and harmful gas is not trapped in the filter and thus is discharged charged from the apparatus before a time for exchange of the filter is indicated.

SUMMARY OF THE INVENTION

An object of this invention is to provide an image forming apparatus capable of completely removing foul and harmful components from gas emitted during a heat-fixing process and preventing them from being leaked to the outside of the apparatus.

Another object of this invention is to provide an image forming apparatus capable of setting a weighted count value for each of various types of developer sheets having different gas-emission characteristics to accurately indicate a time for exchange of the filter for the emitted gas, whereby the used filter is exchanged for a new one before foul and harmful gas is permitted to escape to the outside of the apparatus.

Another object of this invention is to provide an image forming apparatus capable of accurately indicating a time for exchange of the filter for purifying gas even if the filter is naturally degraded from non-used.

In order to attain the above objects, an image forming apparatus according to this invention in which a series of image forming processes are carried out to form a visible image on a recording medium, comprises fixing means for fixing the visible image on the recording medium to perform an image fixing process, gas purifying means for removing foul and harmful components from gas emitted from the recording medium in the image fixing process, counting means for accumulatively counting every image fixing process to indicate an accumulative number of times the image fixing process is performed, weighting means for weighting a count value of the counting means in accordance with the types of recording medium to be presently subjected to the image fixing process and adding a weighted count value to a just-previously accumulated count value to obtain a present accumulative number, and first monitoring means for monitoring the accumulative number of the counting means and indicating a time for exchange of the gas purifying means on the basis of the monitored accumulative count value.

The image forming apparatus further comprises a time measuring means for measuring a time lapse since the gas purifying means was exchanged for a new one, and a second monitoring means for monitoring the time lapse measured by the time measuring means and indicating a time for exchange of the gas purifying means on the basis of the monitored time lapse.

BRIEF DESCRIPTION OF THE DRAWINGS

FIG. 7 shows a flow chart of the auxiliary control system as shown in FIG. 5.

DETAILED DESCRIPTION OF THE INVENTION

Preferred embodiments of this invention will be described hereunder with reference to the accompanying drawings.

Figure 1:
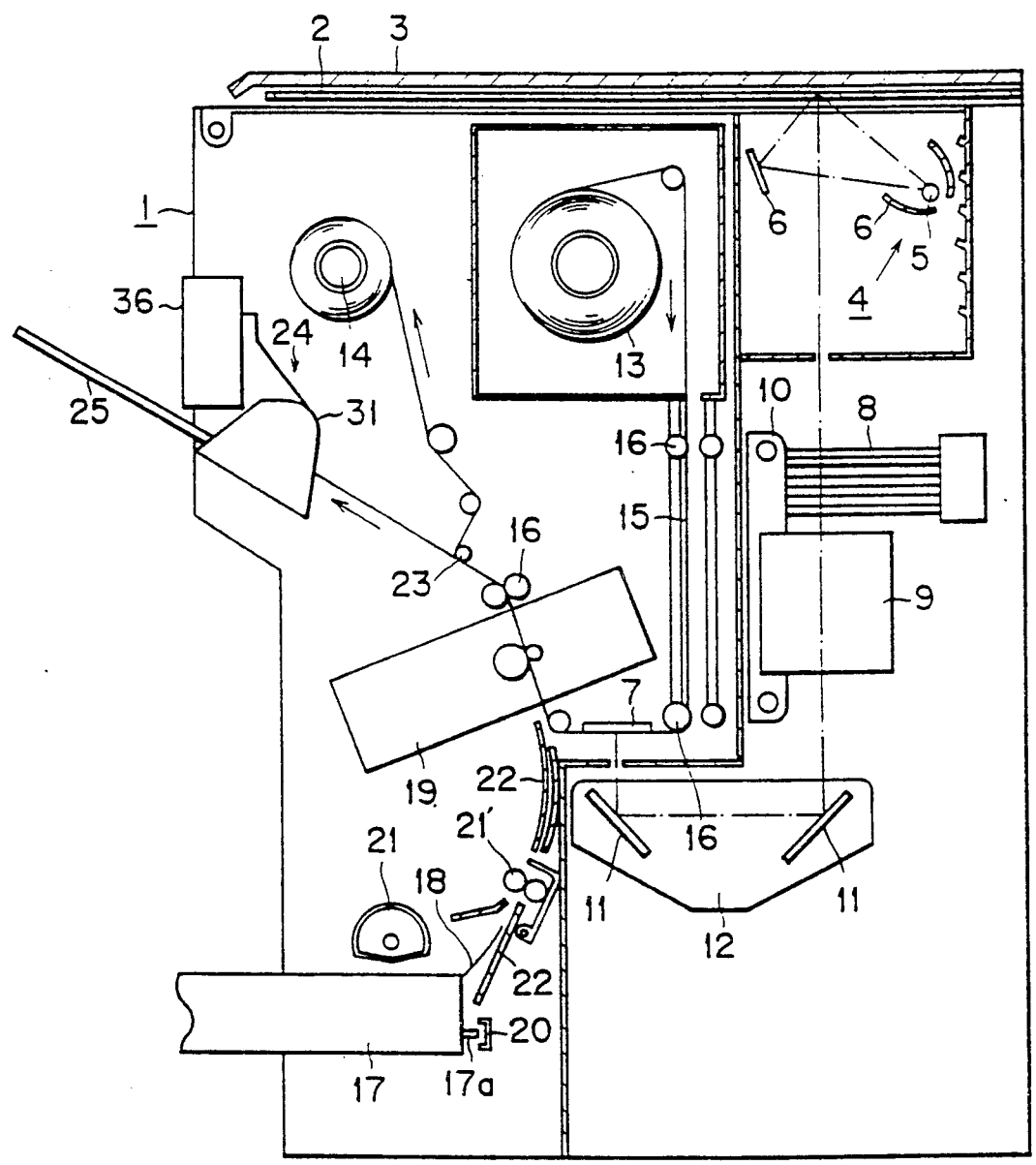
FIG. 1 is a schematic view of an image forming apparatus having a heat-fixing unit according to the invention.

FIG. 1 is a schematic view of an image forming apparatus such as a copying machine according to the present invention.

As shown in FIG. 1, the apparatus includes a body frame 1 having an upper portion provided with an original support glass plate 2, for mounting thereon an original (not shown), and a cover 3 for covering and uncovering the original support glass plate 2. The glass plate 2 and the cover 3 are movable in a horizontal direction. A light source 1 including a halogen lamp 5 and reflectors 6 is provided below the original support glass plate 2. The halogen lamp 5 is adapted for irradiating light to the original on the glass plate 2 and extends in a direction perpendicular to the moving direction of the original support glass plate 2. The reflectors 6 are adapted to direct light emitted from the halogen lamp 5 through the original support glass plate 2 to the original. During light irradiation from the light source 4, the original support glass plate 2 is moved in horizontal direction, so that an entire area of the original is scanned with the light.

An exposure stand 7 is disposed at an internal central portion of the body frame 1. Further, a color filter unit 8 for adjusting a color tone and a focusing lens unit 9 are disposed between the light source 4 and the exposure stand 7. The color filter 8 and the lens unit 9 are supported by an attachment plate 10. A pair of reflection mirrors 11 are disposed between the lens unit 9 and the exposure stand 7 for adjusting a light path length and focal length. These reflection mirrors 11 are movably supported on an attachment member 12. The light from the light source 4 is reflected from the original and is directed toward the exposure stand 7 through the color filter 8, the lens unit 9 and the reflection mirrors 11.

A sheet cartridge 13 is detachably provided at an upper internal space of the body frame 1. Within the cartridge 13, an elongated web-like photosensitive sheet 15 is installed in a rolled state. A microcapsule sheet coated with a plurality of microcapsules which encapsulate therein chromogenic material or dye precursor as the photosensitive sheet is used. Beside the sheet cartridge 13, there s provided a takeup shaft 14 which is rotatable for winding the microcapsule sheet 15 thereon. A plurality of feed rollers 16 are rotatably provided to feed and guide the microcapsule sheet 15 through a sheet feed path to the takeup shaft 14. The microcapsule sheet 15 drawn from of the sheet cartridge 13 is wound over the takeup shaft 14 by means of the feed rollers 16. During the travel of the sheet 15, it passes along a lower surface of the exposure stand 7 at which the sheet 15 is exposed to an image light reflected from the original to form a latent image corresponding to an image of the original on the sheet 15.

A sheet cassette 17 is detachably provided at a lower inner portion of the body frame 1 and below the exposure stand 7. The cassette 17 is for storing a stack of cut developer sheets 18, each coated with developer material and having a predetermined size. The developer sheet 18 may include a base formed of a transparent plastic film for use in an overhead projector.

A pressure developing unit 9 is disposed at a position between the exposure stand 7 and the takeup shaft 14. In the pressure developing unit 19, the light-exposed microcapsule sheet 15 is superposed with one of the developer sheets 18 under pressure, so that the non-light exposed microcapsules on the microcapsule sheet 15 are ruptured to induce a chromogenic reaction between the dye precursor issued from the ruptured microcapsules and the developer material coated on the developer sheet 18. As a result, a color output image is formed on the developer sheet 18. The sheet cassette 17 is provided with a protrusion 17a for identifying a size of the sheet to be accommodated in tho cassette 17. The body frame 1 is further provided with a detecting means 20 which detects the protrusion 17a so as to determine the sheet size.

A sector roller 21 (or a suction type of sheet pickup unit) is further provided above the cassette 17 for picking up and feeding the developer sheets 17 one by one. Further, a plurality of feed rollers 21' and a sheet guide 22 are provided between the sheet cassette 17 and the pressure developing unit 19 for transferring the developer sheet 18 from the cassette 17 to the developing unit 19.

At an exit side of the pressure developing unit 19, a separation roller 23 is provided for separating the developer sheet 18 from the microcapsule sheet 15. Further, a heat-fixing unit 24 is disposed downstream of the pressure developing unit 19 for heat-fixing an output image provided on the developer sheet 18. The heat-fixing unit 24 may be of a heated-air blow type or a heat-irradiation type. Furthermore, a discharge tray 25 is provided at an extreme end portion of a developer sheet path for receiving the developer sheet 18 which has been subjected to a heat-fixing treatment in the heat-fixing unit 24.

A copying operation of the image forming apparatus thus constructed will be described hereunder.

The original is first mounted on the original support glass plate 2. Thereafter, a start button (not shown) is switched on to rightwardly move the original support glass plate 2 to a right end and present the left end portion of the original to the halogen lamp 5 of the light source 4. The halogen lamp 5 is then lighted. The original support glass plate 2 is returned leftwardly while the halogen lamp 5 is lighted, thereby performing a scanning operation of the original with the light.

In synchronism with the scanning operation of the original, the microcapsule sheet 15 is fed over the exposure stand 7 to the takeup shaft 14 at the same speed as the return speed of the original support glass plate 2, so that the microcapsule sheet 15 is exposed to an original image reflected from the original to form a latent image on the microcapsule sheet 15. Concurrently, a developer sheet 18 is fed from the sheet cassette 17 to the pressure developing unit 19 in synchronization with the return of the original support glass plate 2 to the left side. The light-exposed microcapsule sheet 15 is superposed with the developer sheet 18 under pressure in the pressure-developing unit 19 to develop the latent image on the microcapsule sheet 15 into a visible image on the developer sheet 18. Thereafter, the developer sheet 18 is fed to the heat-fixing unit 24 by the sheet feed rollers 16, where the visible image is fixed using heat and then the developer sheet 18 is discharged to the tray 25.

Figure 2:
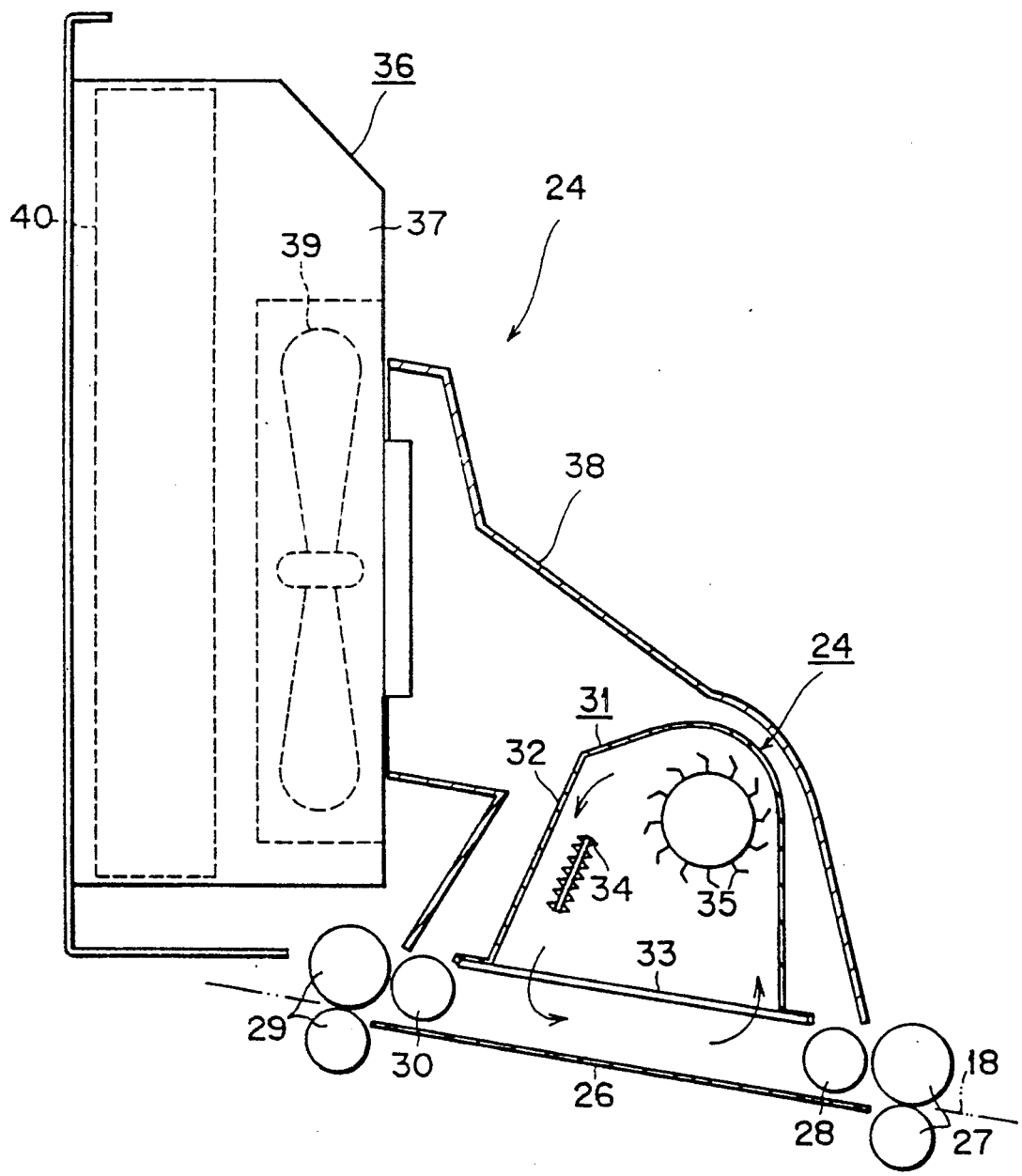
FIG. 2 is a schematic view of a heated air blowing unit and a gas purifying unit of the heat-fixing unit as shown in FIG. 1.

FIG. 2 is a schematic view of the heat-fixing unit 24 according to this invention. The heat-fixing unit 24 of this invention comprises a heated air blowing unit 31 and a gas purifying unit 36.

As shown in FIG. 2, the heat-fixing unit 24 includes a sheet guide 26 provided below a developer sheet path in the heat-fixing unit 24, a pair of sheet feed-in rollers 27 and a pair of sheet feed-out rollers 29 which are rotatably provided at inlet and outlet sides of the sheet guide 26, respectively, and heat insulation rollers 28 and 30 which are provided adjacent to the rollers 27 and 29 respectively, to prevent the heated air from leaking out of the heat-fixing unit 24. The rollers 27 and 29 extend in a direction perpendicular to the running direction of the developer sheet 18. Upon rotation of these rollers, the developer sheet 18 is moved along the sheet guide 26.

Above the sheet guide 26 a heated air blowing unit 31. The heated air blowing unit 31 is provided includes a casing member 32 having a downwardly directed opening and a shielding plate 33 secured to the opening. The shielding plate 33 is formed of, for example, a metallic mesh and with the casing member 32 defines an internal space therein. Within the internal space and at the position adjacent to the outlet side is a heater 34. Heater 36 is, for example, in the form of a coil element made of Nichrome line extending in a direction perpendicular to a sheet feeding direction of the developer sheet 18. Upon the supply of electrical power to the heater 34, ambient air is heated by the heater 34 and the heated air can pass through the meshes of the shielding plate 33.

In addition, a blowing fan 35 such as a cross-flow fan s rotatably provided in the inner space near the inlet side. The blowing fan 35 has a rotation axis extending in a direction perpendicular to the sheet feed path and parallel to the extending direction of the heater 34. A motor (not shown) causes the fan 35 to rotate counterclockwise. Upon actuation of the fan 35, air heated by the heater 34 is supplied to the developer sheet 18, as it is fed over the sheet guide 26, and circulated in the casing member 32 as shown by an arrow in FIG. 2. Between the casing member 32 and the sheet guide 26, a sheet inlet and a sheet outlet are defined at positions inwardly of the sheet feed-in rollers 27 and the sheet feed-out rollers 29. Further, the heat insulation rollers 28 and 30 are rotatably provided adjacent the sheet inlet and outlet respectively. The heat insulation roller 28 is adapted to close and open the sheet inlet and is positioned between the feed-in rollers 32 and the sheet inlet, and the heat insulation roller 30 is adapted to close and open the sheet outlet and is positioned between the feed-out rollers 29 and the sheet outlet. The casing member 32 and the sheet guide 26 constitute in combination a main body of the heated air blowing unit 31.

The heat-fixing unit 24 according to this invention is further provided with a hollow member 38 serving as a duct disposed over an entire area of the heated air blowing unit 31. The inner wall of the hollow member 38 and the outer wall of the casing member 32 define an air passage therebetween, which is also in fluid communication with the sheet inlet and the sheet outlet.

Further, above the heated air blowing unit 31 and within the body frame 1 is a gas purifying unit 36 having a hollow supporting frame 37 which is in communication through the hollow member 38, with the heated air blowing unit 31 of the heat-fixing unit 24. The gas purifying unit 36 is further equipped with a rotatable gas venting (sucking) fan 39 to draw the gas emitted from the developer sheet 18 during the heat-fixing process.

The hollow member 38 serves as a gas duct and is provided between the sheet guide 26 and an intake side of the gas venting fan 39, so that the fan 39 is in fluid communication with the sheet guide 26 and the interior of the heated air blowing unit 31 through the air passage.

The gas purifying unit 36 is further provided a filter 40 detachably mounted in the hollow supporting frame 37 between the gas venting fan 39 and an exhaust port (not shown) for discharging the cleaned gas to the outside of the apparatus as the gas emitted from the developer sheet 18 is sucked through the fan 39 to the filter 40. The filter 40 is a deodorant type filter filled with a deodorant such as activated charcoal for trapping foul and harmful components of the gas and removing them from the gas, so that the gas is cleaned and then discharged to the outside of the apparatus.

Figure 3:
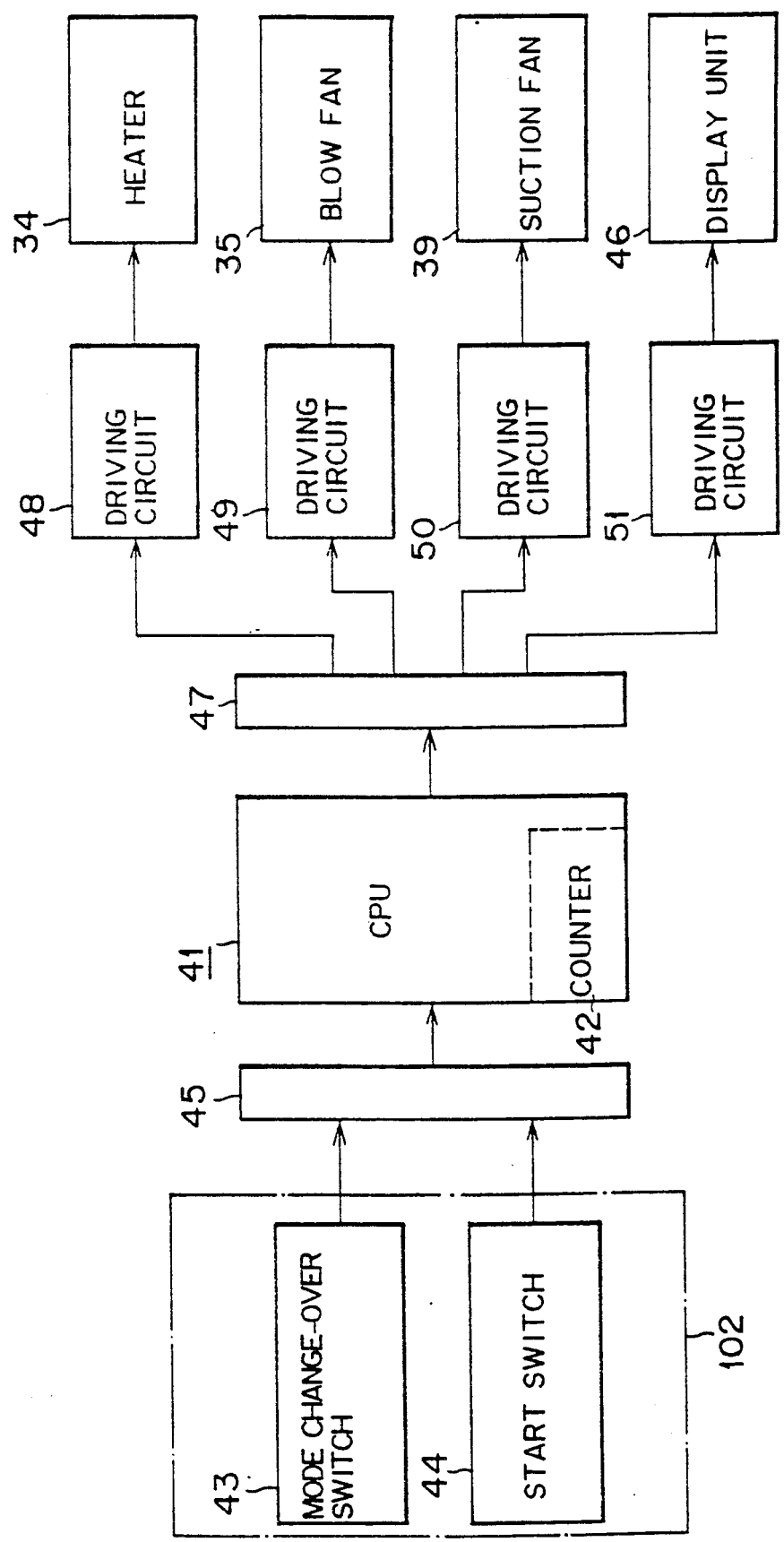
FIG. 3 is a block diagram showing a main control system for performing a series of heat-fixing operations including a gas-purifying operation.

FIG. 3 is a block diagram showing a control system for controlling a series of heat-fixing operations including a gas purification operation.

As shown in FIG. 3, the main control system includes a central processing unit (CPU) 41 having a counter 42 for controlling various elements which perform a series of heat-fixing operations. The CPU 41 is connected through an input interface 45 to an operation panel 102 having a mode change-over switch 43 for switching modes in accordance with the type of developer sheets to be subjected to the heat-fixing processes, a start switch 44 for starting a copying operation, a display unit and other elements for inputting various information such as a number of sheets to be copied and the size of the sheets, so that various instruction signals are input to the CPU 41. The CPU 41 is further connected through an output interface 47, and respective driving circuits 48 to 51, to the heater 34, the fan 35, the suction fan 39 and an indicator 46 for indicating the time to exchange a used deodorant filter 40 for a new one so that various drive-starting and drive-ceasing signals are outputted from the CPU 41 to these elements. The mode change-over switch 43 is used to weight the counted value of the counter 42 in accordance with the type of developer sheets which have different gas-emission amounts during the heat-fixing process. The driving circuits 48 to 51 are used to drive the corresponding elements 34 to 46.

The CPU 41 serves as a count-control means for allowing the counter 42 to count the number of developer sheets 18 which have been subjected to the heat-fixing process (that is, the number of times a heat-fixing operation) has occurred and output a drive-start signal to the indicator 46 through the driving circuit 51 when the counted value reaches a predetermined number. Further, the CPU 41 also serves as a weighting means for weighting the counted value of the counter 42 in accordance with an instruction signal from the mode change-over switch 43. For example, when an user selects mode for an ordinary developer sheet 18 which emits a relatively small amount of gas in the heat-fixing process, no weight is given to the counted value of the counter 42 (in this case, the counted value is multiplied by "1" and thus the weighted counted value is "1"). On the other hand, when the user selects another mode, such as OHP developer sheet 18 which emits a relatively large amount of gas in the heat-fixing process, the counted value of the counter 42 is weighted (in this case, the counted value is multiplied by "2") and thus the weighted counted value is "2").

Counting and filter-exchange indicating operations of the control system as shown in FIG. 3 will be described hereunder.

Figure 4:
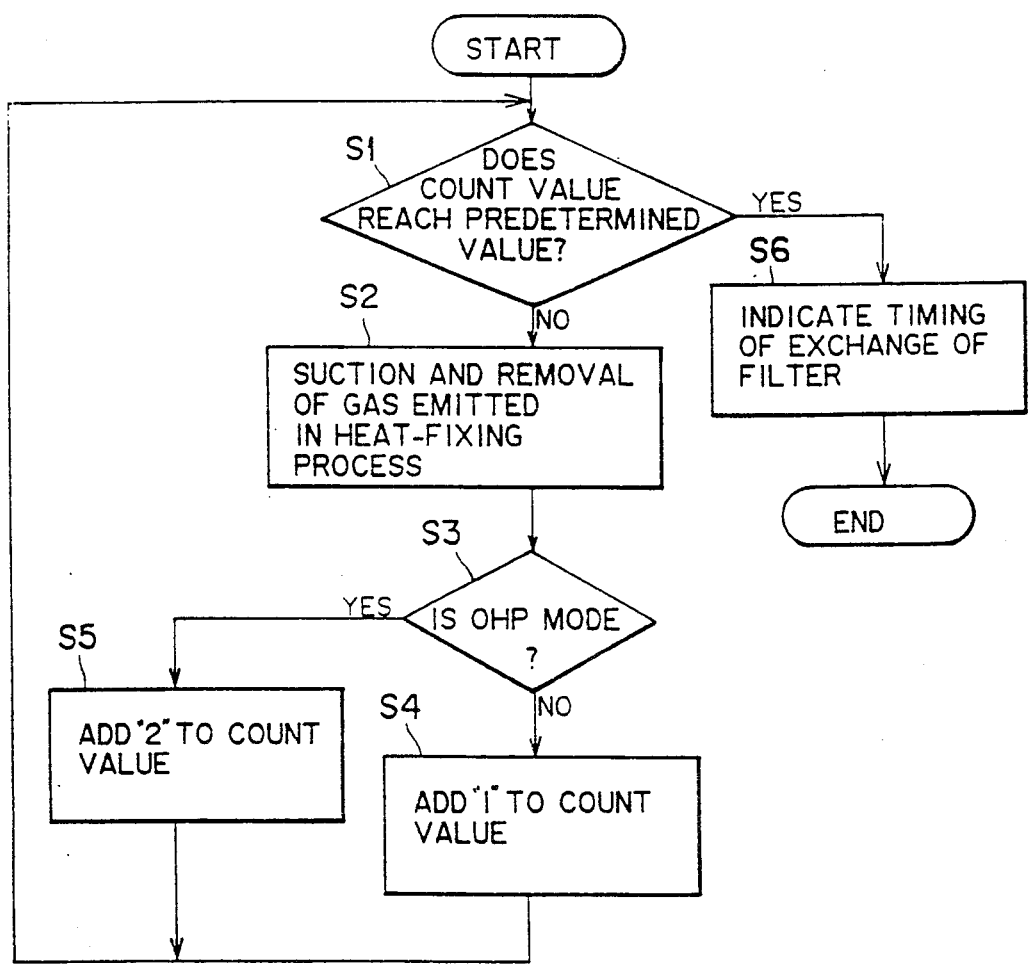
FIG. 4 shows a flow chart of the gas-purifying operation of the main control system.

Upon feeding the developer sheet 18 having a visible image formed thereon from the pressure-developing process to the sheet guide 26 with the start switch 44 on, a series of steps as shown in the flow chart of FIG. 4 are started.

First, it is judged in a step S1 whether a counted value of the counter 42 has reached a predetermined number. If the counted value has not reached the predetermined number, the heater 34 of the heat-fixing unit 24 is supplied with current to heat the ambient air thereby increasing the temperature of the air. At the same time, the fan 35 is rotated by a motor (not shown) and the heated air is blown over the surface of the developer sheet 18 through the opening at the lower portion of the main cover member 32. As a result, a resin layer of developer material coated on the developer sheet 18 is melted to heat-fix the visible image on the developer sheet 18. Simultaneously with the heat-fixing operation, the suction fan 39 of the gas purifying unit 36 is driven to draw the gas having foul and harmful components, emitted from the developer sheet 18 through the hollow member 38 to the hollow supporting member 37. In the hollow supporting member 37, the foul and harmful components are removed from the gas by the deodorant filter 40 and then purified gas is discharged to the outside of the apparatus (in a step S2). Therefore, the foul and harmful components are completely retained in the filter 40 and not discharged to the outside of the apparatus so that the user can safely carry out an image forming operation in a purified atmosphere.

Further, it is judged in a step S3 whether a mode for an OHP developer sheet is selected by the mode change-over switch 43. If the selected mode is a mode for one of developer sheets other than the OHP developer sheet, the counted value is not weighted and thus "1" is merely added to a previously-counted value of the counter 42. On the other hand, if the selected mode is a mode for the OHP developer sheet, the counted value is weighted and thus "2" is added to the previously-counted value of the counter 42 (in steps S3 to S5). Thereafter, the routine returns to the step S1, and it is judged whether the present counted value has now reached the predetermined number. If it is judged that the counted value has reached the predetermined number, the CPU 41 drives the indicator 46 to indicate it is time to exchange the deodorant filter 40.

As described above, even if there are used various types of developer sheets such as an OHP developer sheet, an ordinarily developer sheet, etc., which emit different amounts of gas in a heat-fixing process (for example, the OHP sheet emits a larger amount of gas than an ordinary developer sheet), the counted value of the counter 42 is weighted in accordance with the kind of the developer sheet, so that the time for exchange of the deodorant filter 40 is accurately indicated even if the various types of the developer sheets have been used. Accordingly, the heat-fixing unit of this invention is not affected by the purifying capability of the filter 40 being remarkably degraded before the counted value of the counter 42 reaches the predetermined value resulting a foul and harmful gas escaping to the outside of the apparatus.

The heat-fixing unit according to the invention is not limited to the above embodiment, however, any modification may be made to the above embodiment. For example, a gas amount detector for detecting an amount of emitted gas maybe provided to the heated air blowing unit 31 of the heat-fixing unit 24 to automatically weight the counted value of the counter 42 in accordance with a detection signal from the detector. In place of the binary weighting operation (multiplying the counted value by 1 or 2) applied to the above embodiment, a ternary weighting operation (for example, multiplying the counted value by 1, 2 or 3) or multi-weighting operation (multiplying the counted value by 4 or more different integers) may be adopted.

When the image forming apparatus including the heat-fixing unit as described above is left unused for a long time, the gas purifying capability of the deodorant filter 40 is naturally reduced as that time elapses. This natural degradation of the filter 40 due to the passage of time causes a problem that even if the counted value of the counter 42 does not reach the predetermined value, the filter 40 is degraded and thus the foul and harmful gas is liable to be discharged to the outside of the apparatus. In order to eliminate the above problem from the image forming apparatus, an auxiliary control system as shown in FIG. 5 is further provided to the control system shown in FIG. 3.

Figure 5:
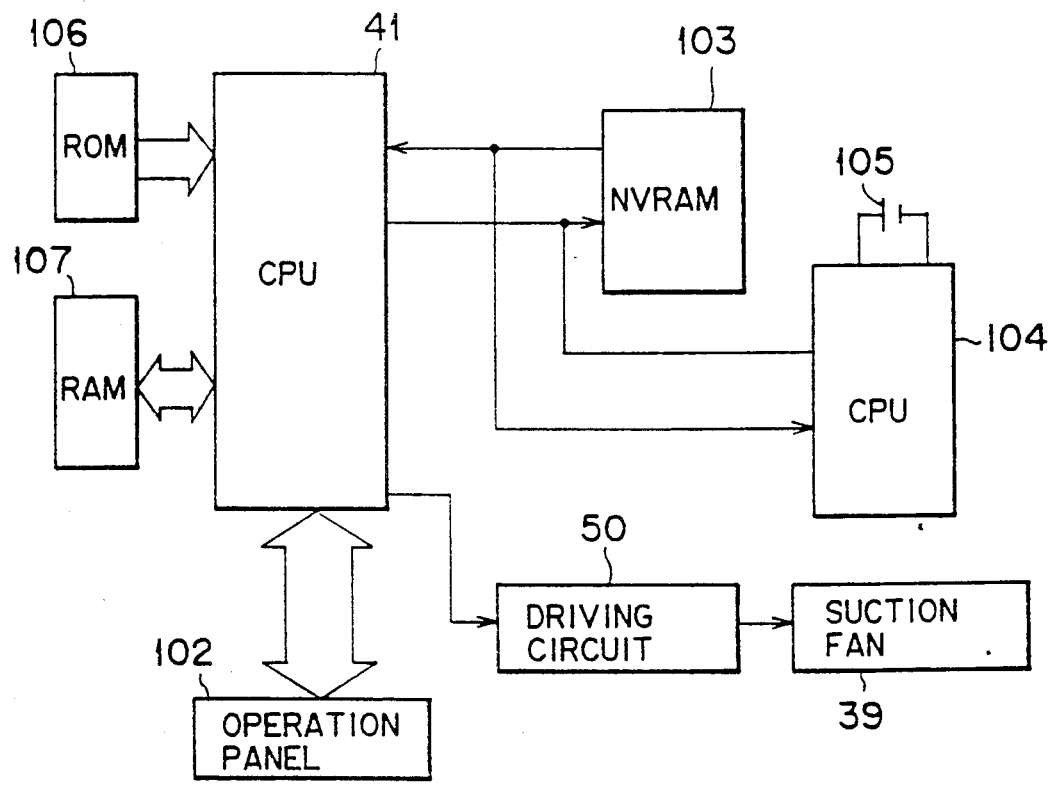
FIG. 5 is a block diagram showing an auxiliary control system for the gas-purification operation.

As shown in FIG. 5, the auxiliary control system for administering a gas purifying capability of the filter 40 basically includes the CPU 41, the operation panel 102, a non-volatile memory (NVRAM) 103 for storing count data of the number of sheets which have been hitherto copied, another CPU 104 for monitoring a time elapsed from the exchange of the filter 40 till now, the driving circuit 50, and the suction fan 39. The CPU 41 may be different from the CPU 41 as shown in FIG. 3. The CPU 104 is connected to a backup power source 105 irrespective of the switching state (ON and OFF states) of the main power source (not shown). The CPU 41 is further connected to a ROM 106 for storing various control programs for the series of heat-fixing processes and a RAM 107 for temporarily storing processing data therein. As described above, the CPU 41 controls a series of actions associated with the heat-fixing process of the image forming apparatus so as to drive various types of motors, lamps, heaters, fans and so on, and various signals are inputted thereto or outputted therefrom. These elements and other elements as shown in FIG. 3 are omitted from FIG. 5 in order to simplify the construction of the auxiliary control system and make it more easily understood.

An operation of the auxiliary control system as shown in FIG. 5 will be described hereunder.

Figure 6:
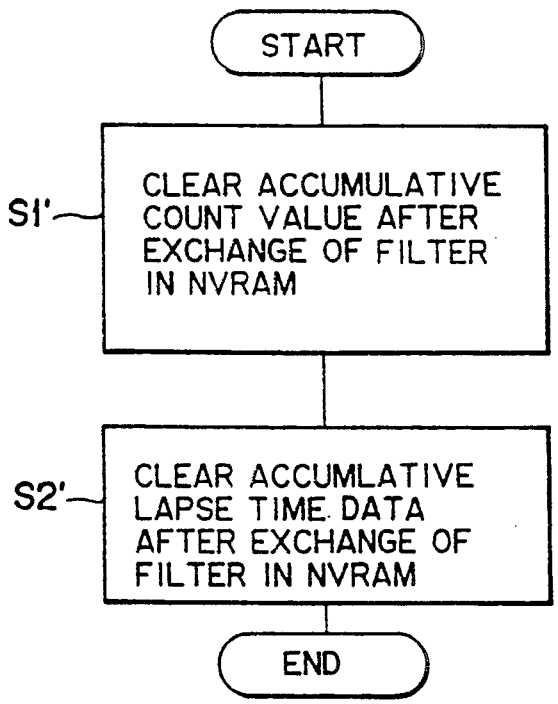
FIG. 6 shows a flow chart of a filter-exchanging operation.

First, an exchanging operation of the filter 40 will be described hereunder with reference to a flow chart as shown in FIG. 6.

When a used deodorant filter is exchanged for a new one, a predetermined switch of the operation panel 102 is pushed to reset the NVRAM 103, that is, to clear a counted value which has been accumulatively counted by the counter 42 (step S1'). Likewise, another predetermined switch of the operation panel 102 is pushed to reset the data on the elapsed time which has been accumulatively measured (step S2'). By beforehand carrying out the above exchanging operation of the filter 40, it is possible that an elapsed time and a number of copied sheets are newly accumulatively monitored after the used filter 40 is exchanged for a new one.

Next, a checking operation of the gas purifying capability of the filter 40 will be described hereunder with reference to a flow chart as shown in FIG. 7.

After the above-exchanging operation is completed and before a copying operation is started, the operator sets the number of sheets to be copied through the operation panel 102 and then carries out the number of copying operations corresponding to the number specified. The counter 42 incrementally counts every copying operation and the counted value is accumulatively stored in the NVRAM 103 by the CPU 41. Meanwhile, the CPU 104 accumulatively stores the time which has elapsed since the exchange of the filter 40.

The following operation is carried out when the image forming apparatus waits for a copying operation or is in a copying operation.

First, the CPU 41 reads the data on the accumulatively-counted number (for example, A) of copied sheets from the NVRAM 103 (step S11). Next, the CPU 41 compares the read counted number with an effective number of sheets for which the deodorant filter 40 is effectively used (step S12). If it is judged that the read counted value is above the effective number (step S12), the deodorant filter 40 may have no gas-purifying capability remaining an indication for indicating it is time to exchange the filter 40 is displayed on the display unit of the operation panel 102, and at the same time the subsequent copying operations are ceased by the control unit 41. On the other hand, if it is judged that the read counted value is below the effective number (step S12), the data on the elapsed time since the filter 40 was exchanged is read from the NVRAM 103 (step S13). If it is judged that the elapsed time exceeds an effective term for which the deodorant filter 40 keeps its gas purifying capability (step S14), the filter 40 may have no gas purifying capability, remaining an indication for indicating it is time to exchange the filter 40 is displayed on the unit and the subsequent copying operations are ceased by the CPU 41 (step S16). If it is judged that the elapsed time does not exceed the effective term (step S14), copying operations are continued (step S15).

If the kind of the deodorant filter 40 is changed to another one, the effective number and the effective term may be changed to predetermined corresponding values. Further, although the above embodiment is applied to a deodorant type of filter 40, however, it may be applied to other types of filters.

In the above embodiment, the auxiliary control system is used in combination with the main control system, however, it may be used alone.

Further, the embodiments as described above are applied to an image forming apparatus using a microcapsule sheet and a developer sheet, however, they may be applied to any kind of image forming apparatus insofar as it emits foul and harmful components in gas, liquid or solid state during an image forming process.

As described above, according to the image forming apparatus of the invention, the time for exchange of a filter 40 is accurately indicated in both the case of a natural (inherent) degradation of the filter 40 due to a long time lapse and that of a rapid exhaustion degradation due to use of different kinds of developer sheets. Further, when time for exchange of the filter 40 is indicated, subsequent copying operations are automatically ceased and thus foul and harmful components are not discharged to the outside of the apparatus.

What is claimed is:

1. An image forming apparatus for performing a series of image forming processes to form a visible image on a recording medium, comprising:

fixing means for fixing the visible image on the recording medium to perform an image fixing process;

gas purifying means for removing foul and harmful components from gas emitted from the recording medium in the image fixing process;

counting means for counting every time a visible image is formed on a recording medium to produce an accumulative number of copies processed through the image fixing process;

weighting means for weighting a count value of said counting means in accordance with a type of the recording medium subjected to the image fixing process and adding a weighted count value to a just-previously accumulated count value to obtain a present accumulative number; and first monitoring means for monitoring the present accumulative number of said counting means and indicating a time for exchange of said gas purifying means on a basis of the monitored present accumulative number.

2. An image forming apparatus as claimed in claim 1, wherein said gas purifying means comprises a deodorant filter.

3. An image forming apparatus as claimed in claim 2, wherein said gas purifying means further comprises a sucking fan for sucking the gas emitted from the recording medium therethrough and introducing the gas to said filter.

4. An image forming apparatus as claimed in claim 1, wherein said first monitoring means includes a comparator for comparing the present accumulative number with a predetermined number and an indicator for indicating a time for exchange of said gas purifying means when said comparator judges that the present accumulative number exceeds the predetermined number.

5. An image forming apparatus as claimed in claim 1, further comprising weighting-value setting means for setting a weighting value of said weighting means in accordance with the type of the recording medium.

6. An image forming apparatus as claimed in claim 1, further comprising time measuring means for measuring time lapse since said gas purifying means was exchanged for a new one.

7. An image forming apparatus as claimed in claim 6, further comprising a second monitoring means for monitoring the time lapse as measured by said time measuring means and indicating a time for exchange of said gas purifying means based on the monitored time lapse.

8. An image forming apparatus as claimed in claim 7, wherein said second monitoring means includes a comparator for comparing the monitored time lapse with a predetermined time value and an indicator for indicating the time for exchange of said gas purifying means when said comparator judges that the time lapse exceeds the predetermined time value.

9. An image forming apparatus as claimed in claim 6, further comprising a control means for ceasing the series of image forming processes when it is judged that at least one of the present accumulative number exceeds the predetermined number and the time lapse exceeds the predetermined time value.

10. An imaging forming apparatus for performing an image forming process to form a visible image on a recording medium, comprising:

fixing means for fixing the visible image on the recording medium in an image fixing process;

gas purifying means for removing foul and harmful components from gas emitted from the recording medium in the image fixing process;

counting means for accumulatively counting every image fixing process, each counted image fixing process being weighted according to the type of recording medium being processed, to produce a weighted accumulative number of recording mediums processed;

time measuring means for measuring a time lapse since said gas purifying means was exchanged for a new one; and control means for ceasing the image forming process when at least one of the weighted accumulative number exceeds a predetermined number and the time lapse exceeds a predetermined time value.

* * * * *